United States Patent
Kitabayashi

(10) Patent No.: US 9,330,916 B2
(45) Date of Patent: May 3, 2016

(54) METHOD OF MANUFACTURING SILICON CARBIDE SEMICONDUCTOR DEVICE

(71) Applicant: Sumitomo Electric Industries, Ltd., Osaka-shi (JP)

(72) Inventor: Hiroyuki Kitabayashi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/699,463

(22) Filed: Apr. 29, 2015

(65) Prior Publication Data

US 2015/0371856 A1   Dec. 24, 2015

(30) Foreign Application Priority Data

Jun. 23, 2014   (JP) .................................. 2014-128202

(51) Int. Cl.
| | |
|---|---|
| H01L 21/04 | (2006.01) |
| H01L 21/304 | (2006.01) |
| H01L 21/683 | (2006.01) |
| H01L 21/3065 | (2006.01) |
| H01L 21/324 | (2006.01) |
| H01L 29/66 | (2006.01) |

(52) U.S. Cl.
CPC .......... *H01L 21/0485* (2013.01); *H01L 21/049* (2013.01); *H01L 21/0475* (2013.01); *H01L 21/304* (2013.01); *H01L 21/3065* (2013.01); *H01L 21/324* (2013.01); *H01L 21/6836* (2013.01); *H01L 29/66068* (2013.01); *H01L 2221/68327* (2013.01)

(58) Field of Classification Search
None
See application file for complete search history.

(56) References Cited

U.S. PATENT DOCUMENTS

| | | | | |
|---|---|---|---|---|
| 6,636,715 B2* | 10/2003 | Kawamura | ......... | G03G 5/08214 399/150 |
| 7,767,563 B2* | 8/2010 | Li | ......... | H01L 21/268 438/572 |
| 8,038,508 B2* | 10/2011 | Lim | ......... | B24B 9/065 451/10 |
| 2006/0183625 A1* | 8/2006 | Miyahara | ......... | C04B 35/053 501/98.4 |
| 2012/0211770 A1* | 8/2012 | Shiomi | ......... | H01L 21/0495 257/77 |
| 2013/0001826 A1* | 1/2013 | Ussing | ......... | B29C 59/022 264/293 |
| 2013/0017671 A1* | 1/2013 | Kitabayashi | ......... | H01L 21/6836 438/464 |
| 2013/0143398 A1* | 6/2013 | Kitabayashi | ......... | H01L 21/046 438/602 |
| 2014/0004636 A1* | 1/2014 | Takahashi | ......... | H01L 33/60 438/29 |
| 2014/0004696 A1 | 1/2014 | Kitabayashi | | |

FOREIGN PATENT DOCUMENTS

JP   2014-011224 A   1/2014

* cited by examiner

*Primary Examiner* — Alexander Ghyka
(74) *Attorney, Agent, or Firm* — Venbale LLP; Michael A. Sartori

(57) ABSTRACT

A silicon carbide substrate having a first main surface and a second main surface opposite to the first main surface is prepared. A surface electrode is formed in contact with the first main surface of the silicon carbide substrate. An adhesive tape is adhered to the surface electrode so as to cover the surface electrode. The silicon carbide substrate is heated at a first pressure lower than atmospheric pressure, with the adhesive tape being adhered to the surface electrode. After the silicon carbide substrate is heated, the second main surface of the silicon carbide substrate is ground. After the second main surface is ground, the second main surface of the silicon carbide substrate is processed at a second pressure lower than atmospheric pressure, with the adhesive tape being adhered to the surface electrode.

22 Claims, 11 Drawing Sheets

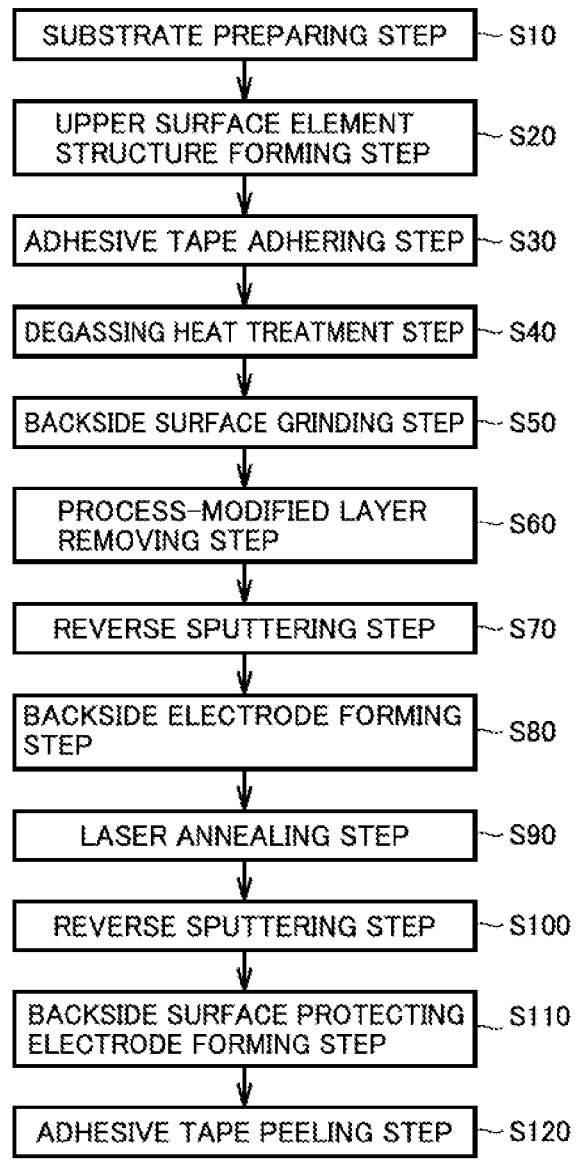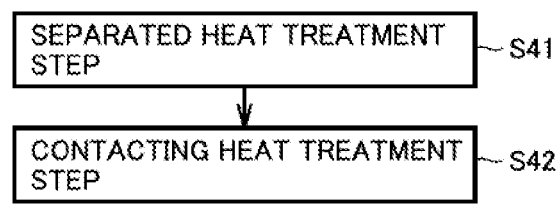

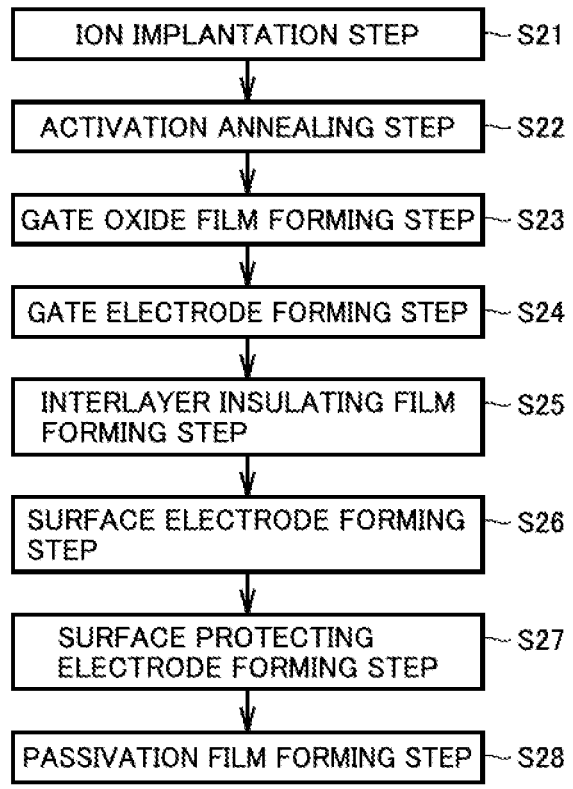
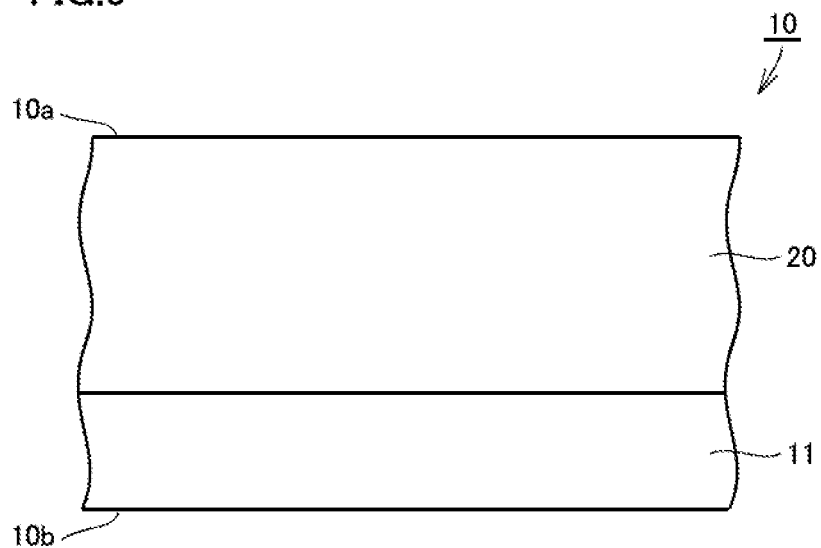

METHOD OF MANUFACTURING SILICON CARBIDE SEMICONDUCTOR DEVICE

BACKGROUND OF THE INVENTION

1. Field of the Invention

The present disclosure relates to methods of manufacturing silicon carbide semiconductor devices.

2. Description of the Background Art

In recent years, silicon carbide has been increasingly employed as a material for a semiconductor device in order to allow a higher breakdown voltage, lower loss and the like of the semiconductor device.

For example, Japanese Patent Laying-Open No. 2014-11224 describes a method of manufacturing a silicon carbide semiconductor device using an adhesive tape. According to the above method of manufacturing a silicon carbide semiconductor device, a backside surface of a silicon carbide substrate is ground with the silicon carbide substrate being fixed on the adhesive tape. By heating the adhesive tape to 100° C. or more after grinding the backside surface of the silicon carbide substrate, liquid water adhered to or contained in the adhesive tape can be vaporized.

SUMMARY OF THE INVENTION

A method of manufacturing a silicon carbide semiconductor device according to the present disclosure includes the following steps. A silicon carbide substrate having a first main surface and a second main surface opposite to the first main surface is prepared. A surface electrode is formed in contact with the first main surface of the silicon carbide substrate. An adhesive tape is adhered to the surface electrode so as to cover the surface electrode. The silicon carbide substrate is heated at a first pressure lower than atmospheric pressure, with the adhesive tape being adhered to the surface electrode. After the silicon carbide substrate is heated, the second main surface of the silicon carbide substrate is ground. After the second main surface is ground, the second main surface of the silicon carbide substrate is processed at a second pressure lower than atmospheric pressure, with the adhesive tape being adhered to the surface electrode.

A method of manufacturing a silicon carbide semiconductor device according to the present disclosure includes the following steps. A silicon carbide substrate having a first main surface and a second main surface opposite to the first main surface is prepared. A surface electrode is formed in contact with the first main surface of the silicon carbide substrate. An adhesive tape is adhered to the surface electrode so as to cover the surface electrode. The silicon carbide substrate is heated at a first pressure lower than atmospheric pressure, with the adhesive tape being adhered to the surface electrode. After the silicon carbide substrate is heated, the second main surface of the silicon carbide substrate is ground. After the second main surface is ground, the second main surface of the silicon carbide substrate is processed at a second pressure lower than atmospheric pressure, with the adhesive tape being adhered to the surface electrode. The first pressure is $1 \times 10^{-5}$ Pa or more and $1 \times 10^{-2}$ Pa or less. A temperature of the silicon carbide substrate in the step of heating the silicon carbide substrate is 100° C. or more and 200° C. or less.

BRIEF DESCRIPTION OF THE DRAWINGS

FIG. 2 is a flowchart schematically showing a method of manufacturing the silicon carbide semiconductor device according to the embodiment.

FIG. 3 is a flowchart schematically showing a degassing heat treatment step in the method of manufacturing the silicon carbide semiconductor device according to the embodiment.

FIG. 4 is a flowchart schematically showing an upper surface element structure forming step in the method of manufacturing the silicon carbide semiconductor device according to the embodiment.

FIG. 5 is a schematic cross-sectional view for schematically illustrating a first step of the method of manufacturing the silicon carbide semiconductor device according to the embodiment.

DETAILED DESCRIPTION OF THE INVENTION

Figure 1:
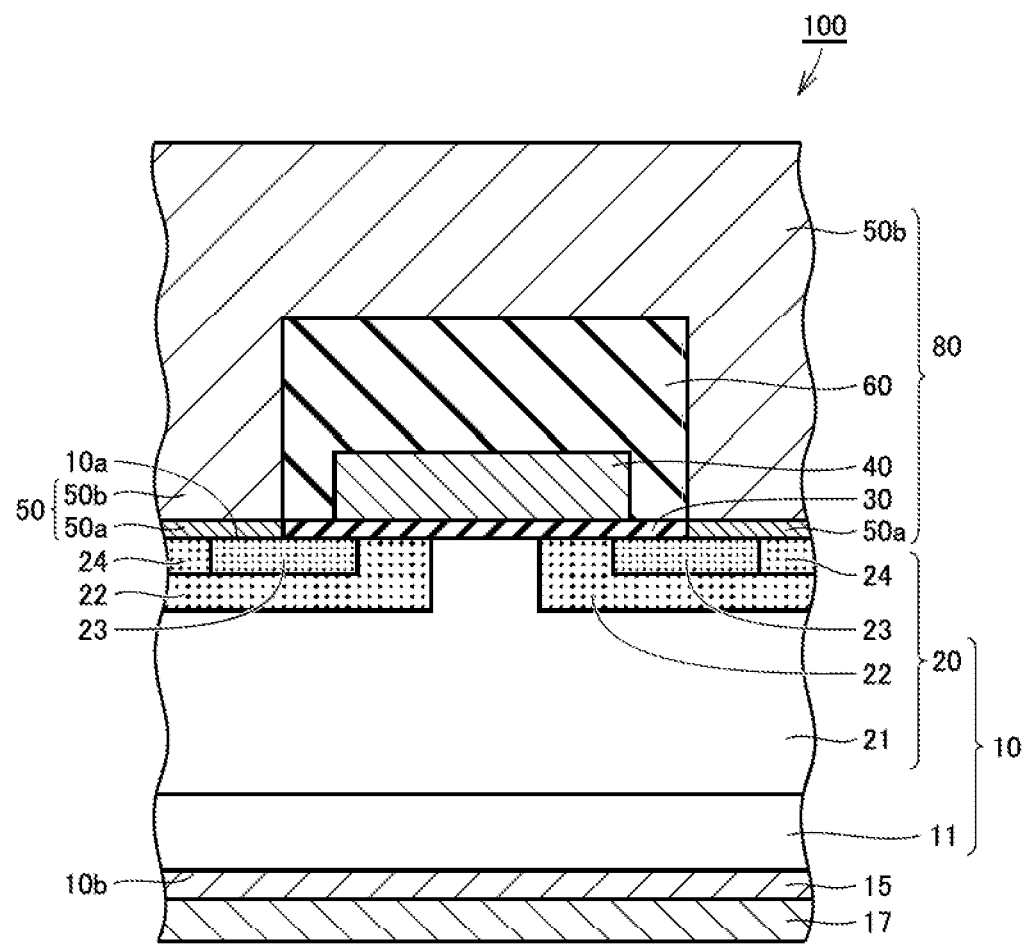
FIG. 1 is a schematic cross-sectional view schematically showing a configuration of a silicon carbide semiconductor device according to one embodiment.

Description of Embodiments (1) A method of manufacturing a silicon carbide semiconductor device according to the present disclosure includes the following steps. A silicon carbide substrate 10 having a first main surface 10a and a second main surface 10b opposite to first main surface 10a is prepared. A surface electrode 50 is formed in contact with first main surface 10a of silicon carbide substrate 10. An adhesive tape 1 is adhered to the surface electrode so as to cover the surface electrode. Silicon carbide substrate 10 is heated at a first pressure lower than atmospheric pressure, with adhesive tape 1 being adhered to surface electrode 50. After silicon carbide substrate 10 is heated, second main surface 10b of silicon carbide substrate 10 is ground. After second main surface 10b is ground, second main surface 10b of silicon carbide substrate 10 is processed at a second pressure lower than atmospheric pressure, with adhesive tape 1 being adhered to surface electrode 50.

According to the method of manufacturing a silicon carbide semiconductor device according to (1) above, before second main surface 10b of silicon carbide substrate 10 is ground, silicon carbide substrate 10 is heated with adhesive tape 1 being adhered to surface electrode 50. Consequently, most of the gas trapped in space between adhesive tape 1 and surface electrode 50 can be exhausted to the outside of the space. Silicon carbide substrate 10 has an increased thickness as compared to silicon carbide substrate 10 having a reduced thickness after its second main surface 10b has been ground, so that the cracking of silicon carbide substrate 10 can be suppressed before silicon carbide substrate 10 is heated. In addition, after the step of grinding second main surface 10b, second main surface 10b of silicon carbide substrate 10 is processed at the second pressure lower than atmospheric pressure, with adhesive tape 1 being adhered to surface electrode 50. Since most of the gas trapped in the space between adhesive tape 1 and surface electrode 50 has been exhausted to the outside of the space before second main surface 10b of silicon carbide substrate 10 is ground, very little gas remains in the space between adhesive tape 1 and surface electrode 50 after second main surface 10b of silicon carbide substrate 10 is ground. Accordingly, while second main surface 10b of silicon carbide substrate 10 is processed at the second pressure lower than atmospheric pressure, the cracking of silicon carbide substrate 10 can be effectively suppressed. A silicon carbide substrate is harder and more susceptible to cracking than a silicon substrate, and thus requires a measure to prevent the cracking of the substrate more than a silicon substrate.

(2) Preferably, in the method of manufacturing a silicon carbide semiconductor device according to (1) above, the first pressure is $1 \times 10^{-5}$ Pa or more and $1 \times 10^{-2}$ Pa or less. By setting the first pressure to $1 \times 10^{-5}$ Pa or more, the process can be readily performed without having to use special high-vacuum equipment or vacuuming for an extended period of time. By setting the first pressure to $1 \times 10^{-2}$ Pa or less, the gas trapped between adhesive tape 1 and surface electrode 50 can be effectively exhausted.

(3) Preferably, in the method of manufacturing a silicon carbide semiconductor device according to (1) or (2) above, the first pressure is equal to or lower than the second pressure. Consequently, the gas trapped between adhesive tape 1 and surface electrode 50 can be sufficiently exhausted before the grinding, thus effectively suppressing the cracking of silicon carbide substrate 10 after the grinding.

(4) Preferably, in the method of manufacturing a silicon carbide semiconductor device according to any one of (1) to (3) above, a temperature of silicon carbide substrate 10 in the step of heating the silicon carbide substrate is 100° C. or more and 200° C. or less. By setting the temperature of silicon carbide substrate 10 to 100° C. or more, water trapped in the space between adhesive tape 1 and surface electrode 50 can be vaporized into water vapor and the water vapor can be effectively exhausted from the space. By setting the temperature of silicon carbide substrate 10 to 200° C. or less, damage to adhesive tape 1 can be effectively prevented.

(5) Preferably, in the method of manufacturing a silicon carbide semiconductor device according to any one of (1) to (4) above, the step of processing second main surface 10b of silicon carbide substrate 10 includes a step of removing, by plasma etching, a process-modified layer 10c formed on second main surface 10b in the step of grinding second main surface 10b. If the gas remains in the space between adhesive tape 1 and surface electrode 50, in the step of removing process-modified layer 10c by plasma etching, local pressure variation occurs to generate abnormal discharge during the release of the gas from between adhesive tape 1 and surface electrode 50 to the outside. This causes adhesive tape 1 to burn and adhere to silicon carbide substrate 10, resulting in difficulty in peeling adhesive tape 1 off. By exhausting the gas existing in the space between adhesive tape 1 and surface electrode 50 before the plasma etching, therefore, the occurrence of abnormal discharge during the plasma etching can be suppressed.

(6) Preferably, in the method of manufacturing a silicon carbide semiconductor device according to any one of (1) to (5) above, the step of processing second main surface 10b of silicon carbide substrate 10 includes a step of forming a backside electrode 15 on second main surface 10b of silicon carbide substrate 10. If the gas such as water vapor remains in the space between adhesive tape 1 and surface electrode 50, gas such as water vapor may be generated to lower film quality of backside electrode 15 during the formation of backside electrode 15 on second main surface 10b. By exhausting the gas existing in the space between adhesive tape 1 and surface electrode 50 before forming backside electrode 15, the lowering of the film quality of backside electrode 15 can be suppressed.

(7) Preferably, in the method of manufacturing a silicon carbide semiconductor device according to (6) above, the step of processing second main surface 10b of silicon carbide substrate 10 includes a step of performing laser annealing on backside electrode 15. The laser annealing locally heats backside electrode 15, thus effectively suppressing an increase in temperature of adhesive tape 1 which results in the generation of gas trapped in the space between adhesive tape 1 and surface electrode 50.

(8) Preferably, in the method of manufacturing a silicon carbide semiconductor device according to any one of (1) to (7) above, a maximum diameter of first main surface 10a of silicon carbide substrate 10 is 100 mm or more. A larger maximum diameter of first main surface 10a of the silicon carbide substrate tends to leave gas between adhesive tape 1 and surface electrode 50 during the adhesion of adhesive tape 1 to surface electrode 50. The above method of manufacturing a silicon carbide semiconductor device is more suitably used when the maximum diameter of first main surface 10a of silicon carbide substrate 10 is 100 mm or more.

(9) Preferably, in the method of manufacturing a silicon carbide semiconductor device according to any one of (1) to (8) above, after the step of grinding the second main surface of the silicon carbide substrate, a thickness T of silicon carbide substrate 10 is 50 μm or more and 200 μm or less. A smaller thickness of silicon carbide substrate 10 tends to cause cracking of silicon carbide substrate 10. The above method of manufacturing a silicon carbide semiconductor device is more suitably used when the thickness of silicon carbide substrate 10 is 50 μm or more and 200 μm or less.

(10) Preferably, the method of manufacturing a silicon carbide semiconductor device according to any one of (1) to (9) above further includes a step of, after the step of processing second main surface 10b of silicon carbide substrate 10, removing adhesive tape 1 from surface electrode 50. Adhesive tape 1 is thus peeled off from silicon carbide substrate 10.

(11) Preferably, in the method of manufacturing a silicon carbide semiconductor device according to any one of (1) to (10) above, the step of heating the silicon carbide substrate includes a step of heating silicon carbide substrate 10 with silicon carbide substrate 10 being separated from a substrate holding unit 3 including a heating unit 3b. Accordingly, the relatively soft adhesive tape readily expands, thus exhausting the gas from between adhesive tape 1 and surface electrode 50. As a result, the cracking of silicon carbide substrate 10 can be effectively suppressed.

(12) Preferably, in the method of manufacturing a silicon carbide semiconductor device according to any one of (1) to (11) above, the step of heating the silicon carbide substrate further includes a step of, after the step of heating silicon carbide substrate 10 with silicon carbide substrate 10 being separated from substrate holding unit 3, heating silicon carbide substrate 10 with silicon carbide substrate 10 being in contact with substrate holding unit 3. Silicon carbide substrate 10 is pressed against substrate holding unit 3, whereby the gas remaining between adhesive tape 1 and surface electrode 50 is pushed and exhausted.

(13) A method of manufacturing a silicon carbide semiconductor device according to the present disclosure includes the following steps. A silicon carbide substrate 10 having a first main surface 10a and a second main surface 10b opposite to first main surface 10a is prepared. A surface electrode 50 is formed in contact with first main surface 10a of silicon carbide substrate 10. An adhesive tape 1 is adhered to surface electrode 50 so as to cover surface electrode 50. Silicon carbide substrate 10 is heated at a first pressure lower than atmospheric pressure, with adhesive tape 1 being adhered to surface electrode 50. After silicon carbide substrate 10 is heated, second main surface 10b of silicon carbide substrate 10 is ground. After second main surface 10b is ground, second main surface 10b of silicon carbide substrate 10 is processed at a second pressure lower than atmospheric pressure, with adhesive tape 1 being adhered to surface electrode 50. The first pressure is $1 \times 10^{-5}$ Pa or more and $1 \times 10^{-2}$ Pa or less. A temperature of silicon carbide substrate 10 in the step of heating the silicon carbide substrate is 100° C. or more and 200° C. or less.

(14) Preferably, in the method of manufacturing a silicon carbide semiconductor device according to (13) above, the first pressure is equal to or lower than the second pressure.

(15) Preferably, in the method of manufacturing a silicon carbide semiconductor device according to (13) above, the step of processing second main surface 10b of silicon carbide substrate 10 includes a step of removing, by plasma etching, a process-modified layer 10c formed on the second main surface in the step of grinding second main surface 10b.

(16) Preferably, in the method of manufacturing a silicon carbide semiconductor device according to (13) above, the step of processing second main surface 10b of silicon carbide substrate 10 includes a step of forming a backside electrode 15 on second main surface 10b of silicon carbide substrate 10.

(17) Preferably, in the method of manufacturing a silicon carbide semiconductor device according to (16) above, the step of processing second main surface 10b of silicon carbide substrate 10 includes a step of performing laser annealing on backside electrode 15.

(18) Preferably, in the method of manufacturing a silicon carbide semiconductor device according to (13) above, a maximum diameter of first main surface 10a of silicon carbide substrate 10 is 100 mm or more.

(19) Preferably, in the method of manufacturing a silicon carbide semiconductor device according to (13) above, after the step of grinding second main surface 10b of silicon carbide substrate 10, a thickness T of silicon carbide substrate 10 is 50 μm or more and 200 μm or less.

(20) Preferably, the method of manufacturing a silicon carbide semiconductor device according to (13) above further includes a step of, after the step of processing second main surface 10b of silicon carbide substrate 10, removing adhesive tape 1 from surface electrode 50.

(21) Preferably, in the method of manufacturing a silicon carbide semiconductor device according to (13) above, the step of heating the silicon carbide substrate includes a step of heating silicon carbide substrate 10 with silicon carbide substrate 10 being separated from a substrate holding unit 3 including a heating unit 3b.

(22) Preferably, in the method of manufacturing a silicon carbide semiconductor device according to (21) above, the step of heating the silicon carbide substrate further includes a step of, after the step of heating silicon carbide substrate 10 with silicon carbide substrate 10 being separated from substrate holding unit 3, heating silicon carbide substrate 10 with silicon carbide substrate 10 being in contact with substrate holding unit 3.

Details of Embodiments

An embodiment will be described below with reference to the drawings. In the following drawings, the same or corresponding parts are designated by the same reference numbers and description thereof will not be repeated. Regarding crystallographic denotation herein, an individual orientation, a group orientation, an individual plane, and a group plane are shown in [ ], < >, ( ), and { }, respectively. Although a crystallographically negative index is normally expressed by a number with a bar "-" thereabove, a negative sign herein precedes a number to indicate a crystallographically negative index.

There is first described a configuration of a MOSFET (Metal Oxide Semiconductor Field Effect Transistor) as an example of a semiconductor device 100 manufactured with a manufacturing method according to one embodiment.

Referring to FIG. 1, MOSFET 100 according to the embodiment mainly includes a silicon carbide substrate 10, an upper surface element structure 80, a drain electrode 15, and a backside surface protecting electrode 17. Substrate 10 is silicon carbide substrate 10 made of silicon carbide, for example. Silicon carbide substrate 10 includes, for example, a silicon carbide single-crystal substrate 11 and a silicon carbide epitaxial layer 20. Silicon carbide single-crystal substrate 11 is made of hexagonal silicon carbide single crystal having a polytype of 4H, for example. Silicon carbide single-crystal substrate 11 contains an impurity such as nitrogen, and has n type conductivity (first conductivity type).

Silicon carbide substrate 10 has a first main surface 10a and a second main surface 10b opposite to first main surface 10a. First main surface 10a of silicon carbide substrate 10 is a {0001} plane or a plane having an off angle of about 8° or less relative to the {0001} plane. Preferably, first main surface 10a of silicon carbide substrate 10 is a (0001) plane or a plane having an off angle of about 8° or less relative to the (0001) plane, and a backside surface is a (000-1) plane or a plane having an off angle of about 8° or less relative to the (000-1) plane. Silicon carbide single-crystal substrate 11 constitutes second main surface 10b of silicon carbide substrate 10, and silicon carbide epitaxial layer 20 constitutes first main surface 10a of silicon carbide substrate 10.

Silicon carbide epitaxial layer 20 is provided on silicon carbide single-crystal substrate 11, and made of silicon carbide. Silicon carbide epitaxial layer 20 includes a drift region 21, body regions 22, source regions 23, and contact regions 24. Drift region 21 contains an impurity such as nitrogen and has n type conductivity. An impurity concentration in drift region 21 is lower than an impurity concentration in silicon carbide single-crystal substrate 11. Body region 22 has p type conductivity (second conductivity type) Body region 22 contains an impurity such as Al (aluminum) or B (boron). An impurity concentration of aluminum or the like contained in body region 22 is, for example, $1 \times 10^{17}$ cm$^{-3}$.

Source region 23 has n type conductivity. Source region 23 is separated from drift region 21 by body region 22. Source region 23 is provided so as to form a portion of first main surface 10a of silicon carbide substrate 10 and to be surrounded by body region 22. Source region 23 contains an impurity such as P (phosphorus). An impurity concentration in source region 23 is higher than the impurity concentration in drift region 21. The impurity concentration of phosphorus or the like contained in source region 23 is, for example, $1 \times 10^{20}$ cm$^{-3}$.

Contact region 24 has p type conductivity. Contact region 24 is provided through source region 23 to come in contact with both first main surface 10a of silicon carbide substrate 10 and body region 22. Contact region 24 contains an impurity such as Al or B. An impurity concentration in contact region 24 is higher than the impurity concentration in body region 22. The impurity concentration of Al or B contained in contact region 24 is, for example, $1 \times 10^{20}$ cm$^{-3}$.

Upper surface element structure 80 mainly includes a gate oxide film 30, a gate electrode 40, a surface electrode 50, and an interlayer insulating film 60. Gate oxide film 30 is formed on first main surface 10a of silicon carbide substrate 10 so as to extend from an upper surface of one of source regions 23 to an upper surface of the other source region 23. Gate oxide film 30 is formed in contact with source regions 23, body regions 22 and drift region 21. Gate oxide film 30 is made of silicon dioxide, for example.

Gate electrode 40 is disposed in contact with gate oxide film 30 so as to extend from a portion over one of source regions 23 to a portion over the other source region 23. Gate electrode 40 is provided in contact with gate oxide film 30 in a position facing source regions 23, body regions 22 and drift region 21. Gate electrode 40 is made of a conductor such as polysilicon containing an impurity or Al.

Surface electrode 50 includes source electrodes 50a, and a surface protecting electrode 50b provided on source electrodes 50a. Each of source electrodes 50a is provided on first main surface 10a of silicon carbide substrate 10, in contact with source region 23 and contact region 24. Source electrode 50a is provided in contact with gate oxide film 30 so as to extend to a portion over contact region 24 in a direction away from gate oxide film 30. Source electrode 50a is made of a material including Ti, Al and Si, for example, and in ohmic contact with source region 23 of silicon carbide substrate 10. Surface protecting electrode 50b is made of a material including Al, for example, and electrically connected to source electrode 50a.

Interlayer insulating film 60 is provided in contact with gate electrode 40 and gate oxide film 30 so as to cover gate electrode 40. Interlayer insulating film 60 electrically insulates gate electrode 40 and source electrodes 50a from each other. Surface protecting electrode 50b is provided in contact with source electrodes 50a so as to cover interlayer insulating film 60.

Drain electrode 15 is provided in contact with second main surface 10b of silicon carbide substrate 10. Drain electrode 15 is made of a material including NiSi, for example, and in ohmic contact with silicon carbide single-crystal substrate 11. Drain electrode 15 is electrically connected to silicon carbide single-crystal substrate 11. Backside surface protecting electrode 17 is formed in contact with a main surface of drain electrode 15 opposite to the surface on which silicon carbide single-crystal substrate 11 is provided. Backside surface protecting electrode 17 is made of a material including Al, for example. Backside surface protecting electrode 17 is electrically connected to drain electrode 15.

Next, a method of manufacturing the MOSFET according to the embodiment is described.

First, a substrate preparing step (S10: FIG. 2) is performed. Specifically, an ingot (not shown) made of a silicon carbide single crystal having a polytype of 4H, for example, is sliced to prepare silicon carbide single-crystal substrate 11 made of hexagonal silicon carbide single crystal and having n type conductivity. Next, n type silicon carbide epitaxial layer 20 is formed on silicon carbide single-crystal substrate 11 by epitaxial growth. Silicon carbide epitaxial layer 20 contains an impurity such as nitrogen ions. A maximum diameter of first main surface 10a of silicon carbide substrate 10 is 100 mm or more, preferably 150 mm or more, and more preferably 200 mm or more. First main surface 10a of silicon carbide substrate 10 may be, for example, a {0001} plane or a plane having an off angle of about 8° or less relative to the {0001} plane. Silicon carbide single-crystal substrate 11 constitutes second main surface 10b of silicon carbide substrate 10, and silicon carbide epitaxial layer 20 constitutes first main surface 10a of silicon carbide substrate 10 (see FIG. 5).

Next, an upper surface element structure forming step (S20: FIG. 2) is performed. The upper surface element structure is formed by performing the following steps, for example.

Figure 6:
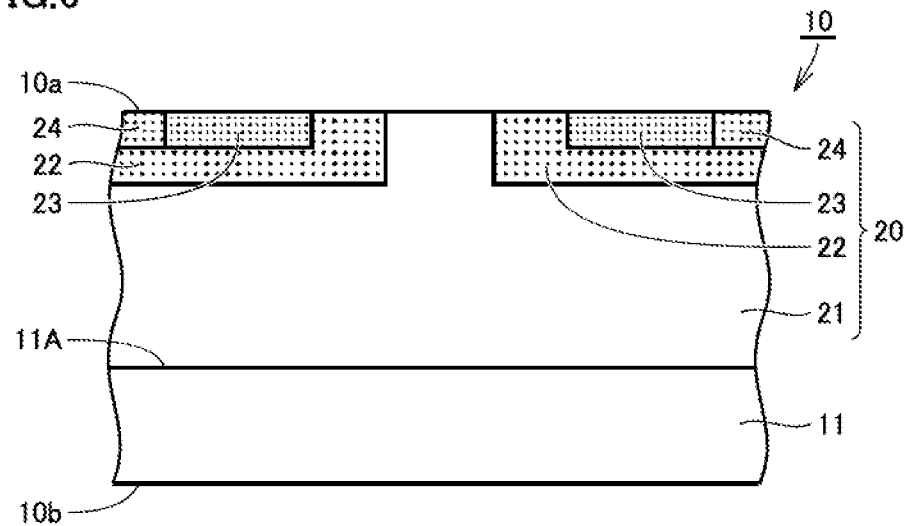
FIG. 6 is a schematic cross-sectional view for schematically illustrating a second step of the method of manufacturing the silicon carbide semiconductor device according to the embodiment.

First, an ion implantation step (S21: FIG. 4) is performed. Referring to FIG. 6, first, for example, Al (aluminum) ions are implanted through first main surface 10a of silicon carbide substrate 10, thereby forming body regions 22 of p type conductivity in silicon carbide epitaxial layer 20. Next, for example, P (phosphorus) ions are implanted into each of body regions 22 to a depth shallower than the depth to which the Al ions have been implanted, thereby forming source region 23 of n type conductivity Next, for example, Al ions are further implanted into source region 23, thereby forming contact region 24 of p type conductivity through source region 23 to reach body region 22. In silicon carbide epitaxial layer 20, a region in which none of body region 22, source region 23, and contact region 24 is formed serves as drift region 21.

Next, an activation annealing step (S22: FIG. 4) is performed. Specifically, by heating silicon carbide substrate 10 for about 30 minutes at a temperature of 1700° C. for example, the impurities implanted in the ion implantation step (S21: FIG. 4) are activated. Consequently, desired carriers are generated in the regions where the impurities have been implanted.

Figure 7:
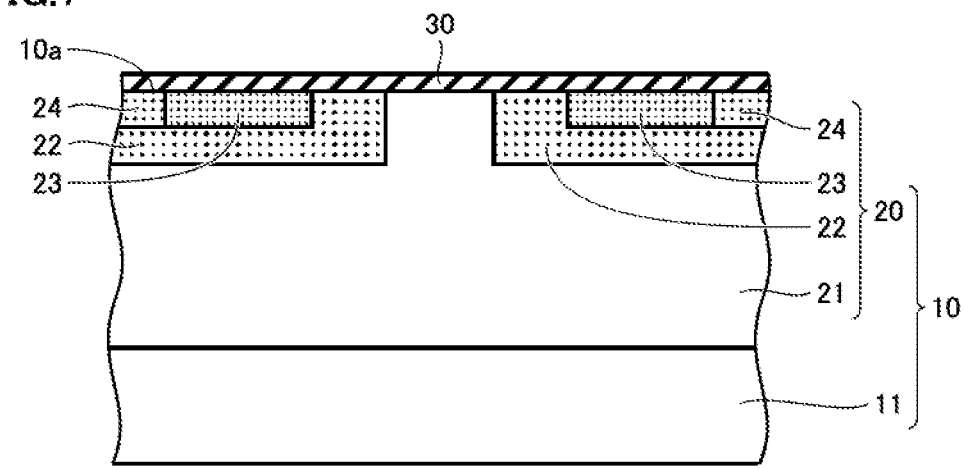
FIG. 7 is a schematic cross-sectional view for schematically illustrating a third step of the method of manufacturing the silicon carbide semiconductor device according to the embodiment.

Next, a gate oxide film forming step (S23: FIG. 4) is performed. Referring to FIG. 7, for example, by heating silicon carbide substrate 10 in an atmosphere containing oxygen, gate oxide film 30 made of silicon dioxide is formed in contact with first main surface 10a of silicon carbide substrate 10. Silicon carbide substrate 10 is heated for about 60 minutes at a temperature of about 1300° C., for example. Gate oxide film 30 is formed on first main surface 10a of silicon carbide substrate 10, in contact with drift region 21, body regions 22, source regions 23, and contact regions 24.

Figure 8:
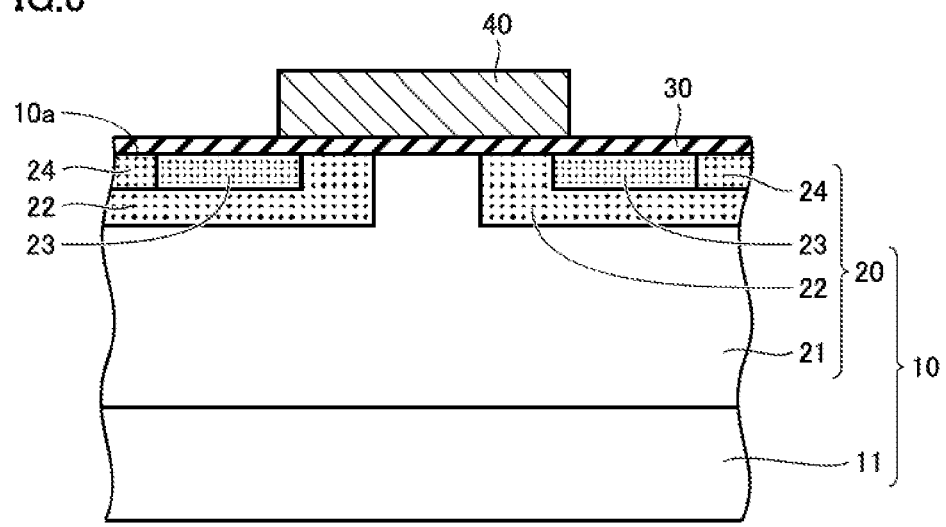
FIG. 8 is a schematic cross-sectional view for schematically illustrating a fourth step of the method of manufacturing the silicon carbide semiconductor device according to the embodiment.

Next, a gate electrode forming step (S24. FIG. 4) is performed. Referring to FIG. 8, gate electrode 40 made of polysilicon containing an impurity is formed on gate oxide film 30 by LPCVD (Low Pressure Chemical Vapor Deposition), for example. Gate electrode 40 is formed in a position facing source regions 23, body regions 22 and drift region 21, with gate oxide film 30 interposed therebetween.

Figure 9:
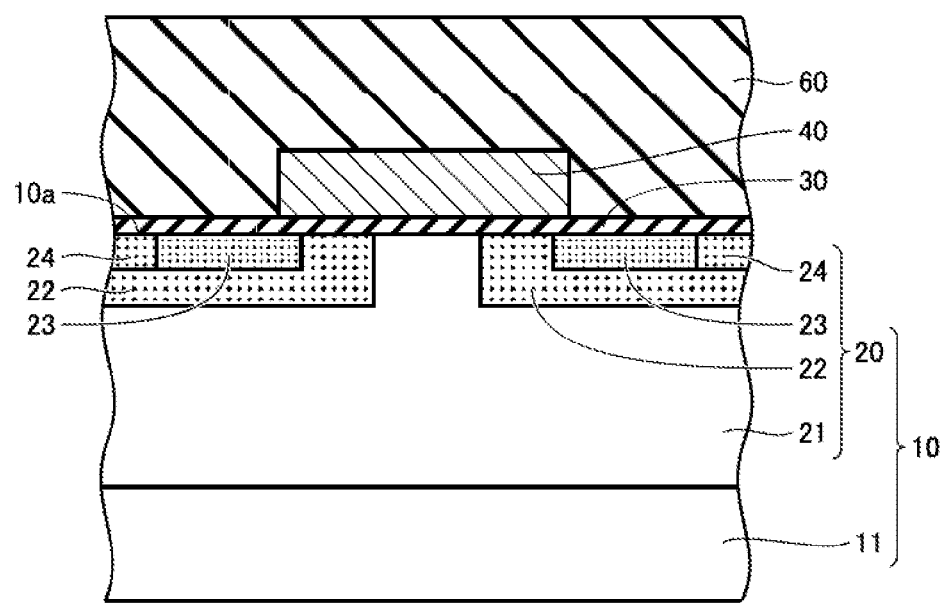
FIG. 9 is a schematic cross-sectional view for schematically illustrating a fifth step of the method of manufacturing the silicon carbide semiconductor device according to the embodiment.

Next, an interlayer insulating film forming step (S25: FIG. 4) is performed. Referring to FIG. 9, interlayer insulating film 60 is formed by plasma CVD (Chemical Vapor Deposition), for example, so as to cover gate electrode 40 and come into contact with gate oxide film 30. Interlayer insulating film 60 is made of a material including silicon dioxide, for example.

Figure 10:
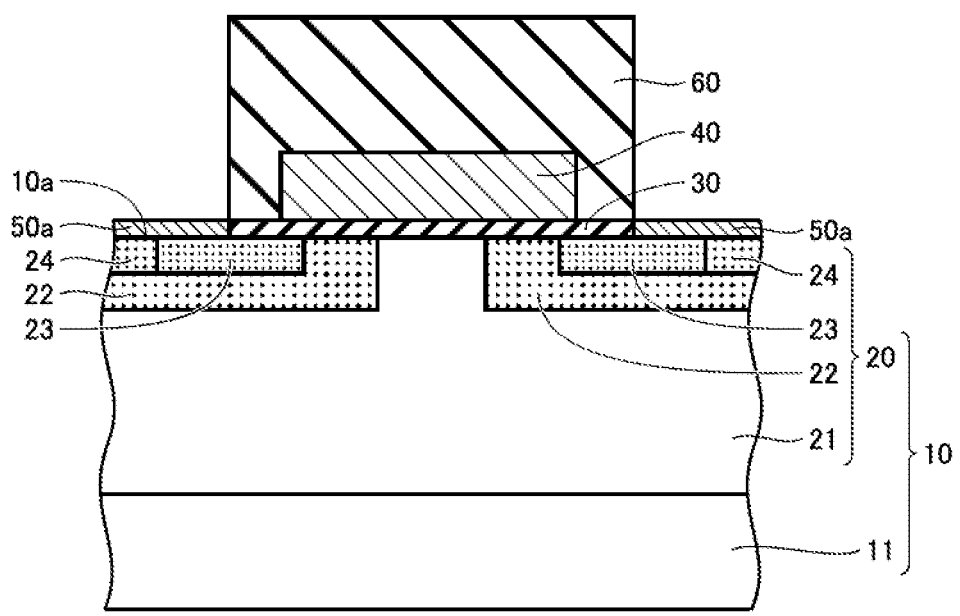
FIG. 10 is a schematic cross-sectional view for schematically illustrating a sixth step of the method of manufacturing the silicon carbide semiconductor device according to the embodiment.

Next, a surface electrode forming step (S26: FIG. 4) is performed. Specifically, interlayer insulating film 60 and gate oxide film 30 are removed by etching, for example, from regions where source electrodes 50a are to be formed, thereby forming regions at which source regions 23 and contact regions 24 are exposed. Next, referring to FIG. 10, a metal layer including TiAlSi (titanium aluminum silicon), for example, is formed by sputtering, for example, in each of the regions at which source regions 23 and contact regions 24 are exposed. By heating the metal layer to about 100° C., for example, at least a portion of the metal layer is silicided to form source electrode 50a in ohmic contact with source region 23.

Next, a surface protecting electrode forming step (S27: FIG. 4) is performed. Specifically, surface protecting electrode 50b is formed by sputtering, for example, so as to come into contact with source electrodes 50a and cover interlayer insulating film 60. Surface protecting electrode 50b is made of a material including aluminum, for example. In this manner, surface electrode 50 which includes source electrodes 50a and surface protecting electrode 50b and is in contact with first main surface 10a of silicon carbide substrate 10 is formed.

Figure 11:
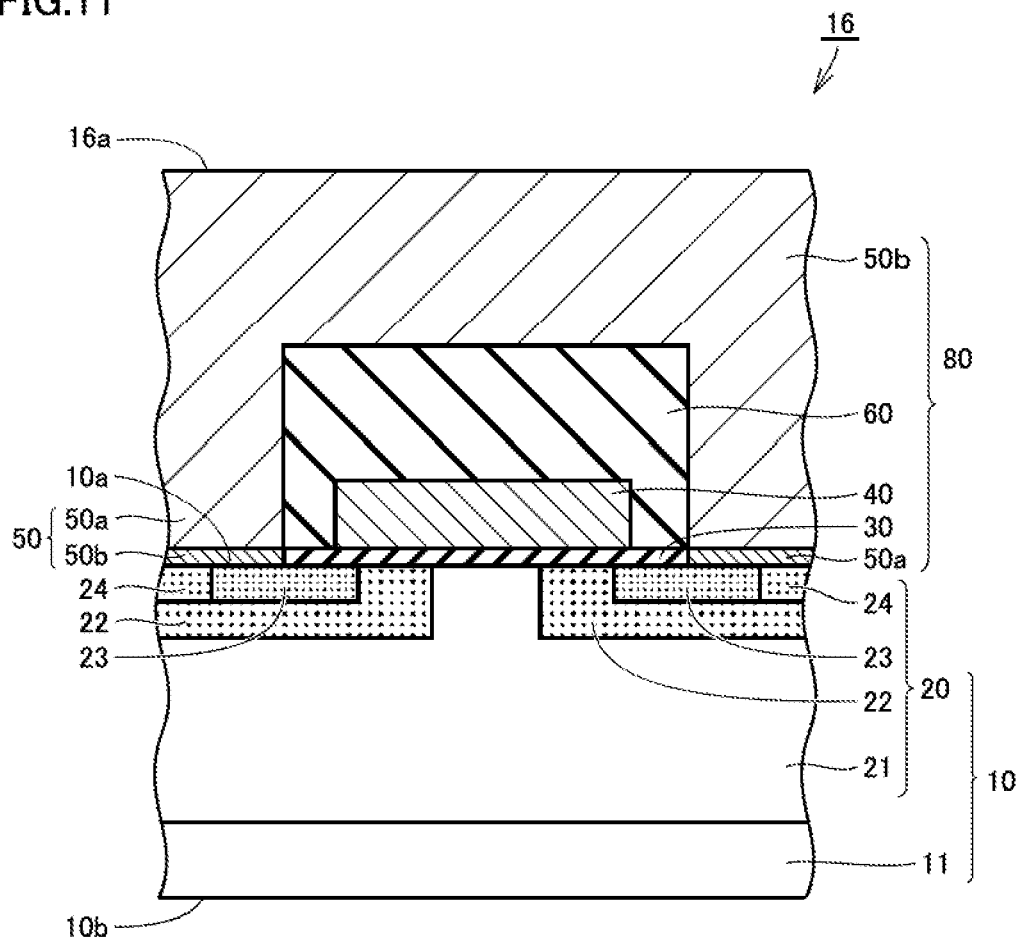
FIG. 11 is a schematic cross-sectional view for schematically illustrating a seventh step of the method of manufacturing the silicon carbide semiconductor device according to the embodiment.

Next, a passivation film forming step (S28. FIG. 4) is performed. Specifically, a passivation film (not shown) is formed by CVD, for example, so as to cover a portion of surface protecting electrode 50b. The passivation film is made of silicon dioxide, for example. In this manner, the upper surface element structure forming step (S20: FIG. 2) is completed. An intermediate substrate 16 having a third main surface 16a and second main surface 10b opposite to third main surface 16a is thus prepared. Intermediate substrate 16 includes silicon carbide substrate 10, and upper surface element structure 80 provided on silicon carbide substrate 10 (see FIG. 11). Upper surface element structure 80 constitutes third main surface 16a of intermediate substrate 16.

Next, an adhesive tape adhering step (S30: FIG. 2) is performed. An adhesive tape 1 has a fourth main surface 1a and a fifth main surface 1b opposite to fourth main surface 1a. Adhesive tape 1 includes, for example, an adhesive portion constituting fourth main surface 1a, and a base portion constituting fifth main surface 1b. An acrylic adhesive agent having adhesion property, for example, can be used as the adhesive portion. An organic compound such as polyester can be used as the base portion. A material having an adhesive strength decreased when irradiated with an energy ray such as an ultraviolet ray is used for the adhesive portion. Examples of materials having an adhesive strength decreased when irradiated with an energy ray such as an ultraviolet ray include an ultraviolet-setting resin. Alternatively, a material having an adhesive strength decreased when heated may be used for the adhesive portion. Examples of materials having an adhesive strength decreased when heated include a thermosetting resin.

Figure 12:
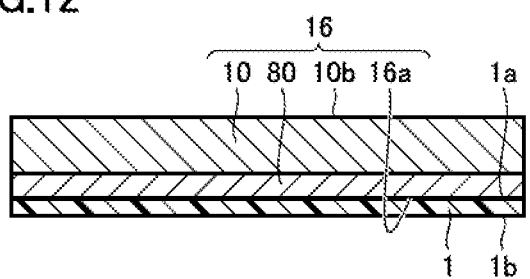
FIG. 12 is a schematic cross-sectional view for schematically illustrating an eighth step of the method of manufacturing the silicon carbide semiconductor device according to the embodiment.
Figure 13:
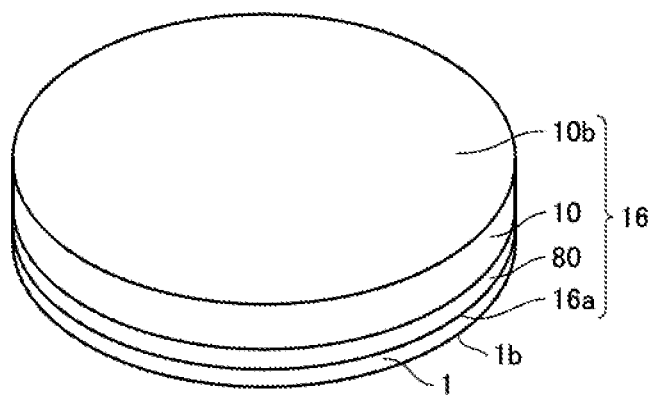
FIG. 13 is a schematic perspective view for schematically illustrating the eighth step of the method of manufacturing the silicon carbide semiconductor device according to the embodiment.

Next, referring to FIGS. 12 and 13, by adhering third main surface 16a of intermediate substrate 16 at the upper surface element structure 80 side to fourth main surface 1a of adhesive tape 1, intermediate substrate 16 is supported by adhesive tape 1. Adhesive tape 1 is adhered to third main surface 16a of intermediate substrate 16 at a pressure of about 30 Pa or more and about 100 Pa or less. Adhesive tape 1 is adhered to surface electrode 50 so as to cover surface electrode 50. A passivation film or the like may be disposed partially between adhesive tape 1 and surface electrode 50. Adhesive tape 1 may be in contact with both surface electrode 50 and the passivation film, or adhesive tape 1 may be disposed above surface electrode 50 with a portion of surface electrode 50 being separated from adhesive tape 1 and with adhesive tape 1 being in contact with the passivation film. Preferably, adhesive tape 1 is adhered to surface electrode 50 so as to cover the entire first main surface 10a of silicon carbide substrate 10. Intermediate substrate 16 is adhered to adhesive tape 1 such that third main surface 16a at the upper surface element structure 80 side comes into contact with fourth main surface 1a of adhesive tape 1. Surface electrode 50 constitutes at least a portion of third main surface 16a. In this manner, third main surface 16a of intermediate substrate 16 is fixed on fourth main surface 1a of adhesive tape 1. It is noted that surface electrode 50, the passivation film and the like are exposed at third main surface 16a of intermediate substrate 16. Accordingly, third main surface 16a of intermediate substrate 16 has protrusions and depressions, with the result that gas tends to be trapped between adhesive tape 1 and surface electrode 50 during the adhesion of adhesive tape 1 to surface electrode 50.

Next, a degassing heat treatment step (S40: FIG. 2) is performed. A first degassing heat treatment step (S40: FIG. 2) includes a separated heat treatment step S41: FIG. 3) and a contacting heat treatment step (S42: FIG. 3).

Figure 22:
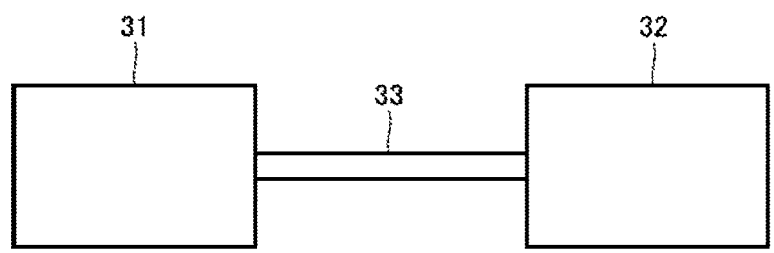
FIG. 22 is a schematic diagram schematically showing a configuration of an apparatus of manufacturing the silicon carbide semiconductor device according to the embodiment.

The separated heat treatment step (S41: FIG. 3) is performed first. Specifically, referring to FIG. 22, intermediate substrate 16 fixed on fourth main surface 1a of adhesive tape 1 is placed in an accommodating chamber 31. Accommodating chamber 31 is connected to a vacuum pump, for example, and has a vacuum state therein. Intermediate substrate 16 with adhesive tape 1 being adhered thereto is transferred to a heat treatment chamber 32 through a connecting unit 33 while the vacuum state is maintained.

Figure 14:
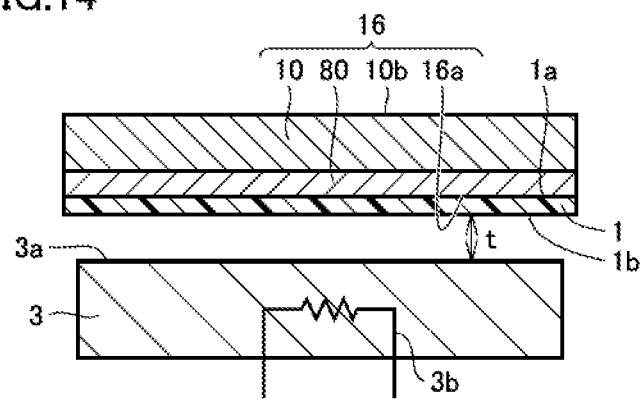
FIG. 14 is a schematic cross-sectional view for schematically illustrating a ninth step of the method of manufacturing the silicon carbide semiconductor device according to the embodiment.

Referring to FIG. 14, intermediate substrate 16 fixed on fourth main surface 1a of adhesive tape 1 is disposed to face a substrate holding surface 3a of a substrate holding unit 3, with a gap provided between fifth main surface 1b of adhesive tape 1 and substrate holding unit 3. Substrate holding unit 3 includes a heating unit 3b capable of raising the temperature of intermediate substrate 16 and adhesive tape 1. By activating heating unit 3b, gas is exhausted from heat treatment chamber 32 while the temperature of intermediate substrate 16 and adhesive tape 1 is maintained at 100° C. or more, with the gap provided between fifth main surface 1b of adhesive tape 1 and substrate holding unit 3. A gap t is about 1 mm, for example. Preferably, gap t is maintained at about 0.5 mm or more and about 2.0 mm or less. The temperature of silicon carbide substrate 10 included in intermediate substrate 16 can be measured by, for example, a radiation thermometer.

In heat treatment chamber 32, intermediate substrate 16 with adhesive tape 1 being adhered thereto is heated to 100° C. or more by heating unit 3b disposed in substrate holding unit 3, for example. Preferably, a pressure in heat treatment chamber 32 (first pressure) is reduced to, for example, $1.5 \times 10^{-4}$ Pa or less. The first pressure in heat treatment chamber 32 in the step of heating silicon carbide substrate 10 is $1 \times 10^{-5}$ Pa or more and $1 \times 10^{-2}$ Pa or less, and more preferably $1 \times 10^{-5}$ Pa or more and $5 \times 10^{-4}$ Pa or less. It is noted that the first pressure in heat treatment chamber 32 is a pressure after a predetermined amount of time has passed (for example, after about 10 to 30 minutes have passed) since the beginning of the heating of intermediate substrate 16. The temperature of adhesive tape 1 and intermediate substrate 16 is preferably maintained at 100° C. or more and 200° C. or less, more preferably maintained at 120° C. or more and 200° C. or less, and further preferably maintained at 140° C. or more and 180° C. or less. In this manner, silicon carbide substrate 10 is heated at the first pressure lower than atmospheric pressure, with adhesive tape 1 being adhered to surface electrode 50.

Figure 15:
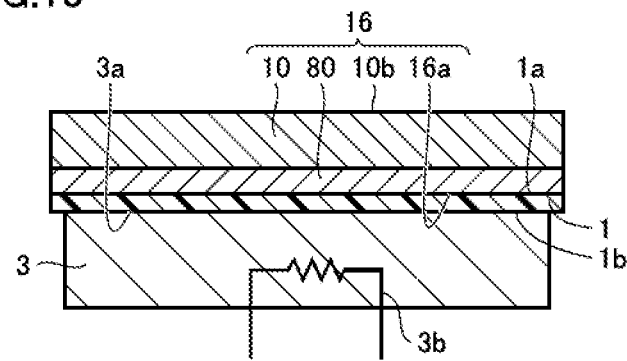
FIG. 15 is a schematic cross-sectional view for schematically illustrating a tenth step of the method of manufacturing the silicon carbide semiconductor device according to the embodiment.

Next, the contacting heat treatment step (S42: FIG. 3) is performed. Specifically, referring to FIG. 15, intermediate substrate 16 fixed on fourth main surface 1a of adhesive tape 1 is disposed to face substrate holding surface 3a of substrate holding unit 3 such that fifth main surface 1b of adhesive tape 1 comes into contact with substrate holding surface 3a of substrate holding unit 3. Intermediate substrate 16 is fixed on substrate holding surface 3a of substrate holding unit 3 by electrostatic adsorption, for example, with adhesive tape 1 interposed therebetween. In the separated heat treatment step (S41: FIG. 3), most of the gas between fourth main surface 1a of adhesive tape 1 and third main surface 16a of intermediate substrate 16 has been released. By adsorbing intermediate substrate 16 to substrate holding surface 3a of substrate holding unit 3 with adhesive tape 1 interposed therebetween, adhesive tape 1 is pressed by both sides, namely, intermediate substrate 16 and substrate holding unit 3. As a result, the gas remaining between fourth main surface 1a of adhesive tape 1 and third main surface 16a of intermediate substrate 16 is exhausted from between fourth main surface 1a of adhesive tape 1 and third main surface 16a of intermediate substrate 16. By activating heating unit 3b, the gas is exhausted from heat treatment chamber 32 while the temperature of silicon carbide substrate 10 and adhesive tape 1 is maintained at 100° C. or more and 200° C. or less, for example, with fifth main surface 1b of adhesive tape 1 being adsorbed to substrate holding surface 3a of substrate holding unit 3. The temperature of silicon carbide substrate 10 and adhesive tape 1 is preferably maintained at 120° C. or more and 200° C. or less, and more preferably maintained at 140° C. or more and 180° C. or less.

Figure 16:
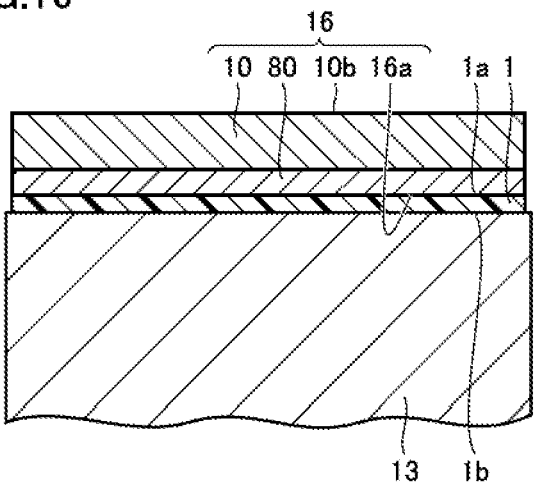
FIG. 16 is a schematic cross-sectional view for schematically illustrating an eleventh step of the method of manufacturing the silicon carbide semiconductor device according to the embodiment.
Figure 17:
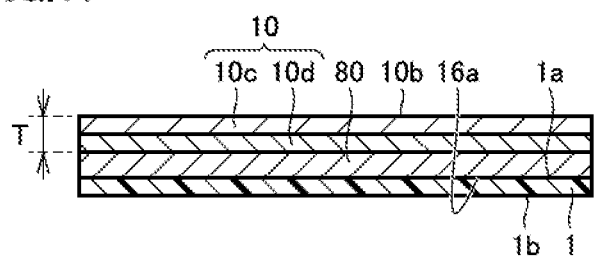
FIG. 17 is a schematic cross-sectional view for schematically illustrating a twelfth step of the method of manufacturing the silicon carbide semiconductor device according to the embodiment.

Next, a backside surface grinding step (S50: FIG. 2) is performed. Specifically, with intermediate substrate 16 being supported by adhesive tape 1, second main surface 10b of intermediate substrate 16 at the silicon carbide single-crystal substrate 11 side is ground. Referring to FIG. 16, intermediate substrate 16 is disposed on substrate holding unit 3 such that fifth main surface 1b of adhesive tape 1 faces substrate holding unit 3. Then, second main surface 10b of silicon carbide substrate 10 is ground by a grinding unit (not shown). Referring to FIG. 17, silicon carbide single-crystal substrate 11 is thinned as a result of the grinding of second main surface 10b of intermediate substrate 16. Silicon carbide single-crystal substrate 11 of silicon carbide substrate 10 is ground from a thickness of 200 μm or more to a thickness of less than 200 μm, for example. The thickness of silicon carbide substrate 10 before the grinding is 500 μm, for example, and a thickness T of silicon carbide substrate 10 after the grinding is 100 μm, for example. Preferably, thickness T of silicon carbide substrate 10 after the grinding of second main surface 10b of silicon carbide substrate 10 is 50 μm or more and 200 μm or less. More preferably, thickness T of silicon carbide substrate 10 after the grinding of second main surface 10b of silicon carbide substrate 10 is 80 μm or more and 150 μm or less, and more preferably 90 μm or more and 110 μm or less. By grinding silicon carbide substrate 10, a process-modified layer 10c is formed on second main surface 10b of silicon carbide substrate 10. A silicon carbide single-crystal layer 10d is between process-modified layer 10c and upper surface element structure 80.

Figure 18:
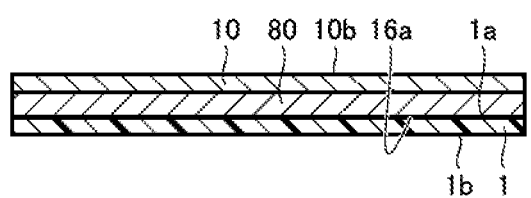
FIG. 18 is a schematic cross-sectional view for schematically illustrating a thirteenth step of the method of manufacturing the silicon carbide semiconductor device according to the embodiment.

Next, a process-modified layer removing step (S60: FIG. 2) is performed. Specifically, intermediate substrate 16 with adhesive tape 1 being adhered thereto is placed in the vacuum chamber having a pressure lower than atmospheric pressure, and then subjected to dry etching. For example, by generating a plasma in the vacuum chamber with a reactive gas such as $SF_6$ being introduced into the vacuum chamber, process-modified layer 10c formed on second main surface 10b of silicon carbide substrate 10 is etched with the plasma, with adhesive tape 1 being adhered to third main surface 16a of intermediate substrate 16. In this manner, after second main surface 10b of silicon carbide substrate 10 is ground, second main surface 10b of silicon carbide substrate 10 is processed at a second pressure lower than atmospheric pressure, with adhesive tape 1 being adhered to surface electrode 50. In the step of processing second main surface 10b of silicon carbide substrate 10, process-modified layer 10c is removed by plasma etching (see FIG. 18). The pressure in the vacuum chamber during the etching (second pressure) is, for example, 1 Pa or more and 5 Pa or less. Preferably, the first pressure at which silicon carbide substrate 10 is subjected to the pressure reduction process before the grinding of the backside surface is equal to or lower than the second pressure at which second main surface 10b of silicon carbide substrate 10 is processed after the grinding of the backside surface.

Next, a reverse sputtering step (S70: FIG. 2) is performed. Specifically, intermediate substrate 16 having silicon carbide substrate 10 from which process-modified layer 10c has been removed is placed in the vacuum chamber. The pressure in the vacuum chamber is, for example, about $1.5 \times 10^{-4}$ Pa. By generating a plasma in the vacuum chamber with an argon gas being introduced therein, for example, a substance adhered to second main surface 10b of silicon carbide substrate 10 is removed. Specifically, second main surface 10b of intermediate substrate 16 is subjected to reverse sputtering in an Ar atmosphere at a pressure of 5 to 10 Pa (second pressure), for example, with application of RF power of 800 W.

Figure 19:
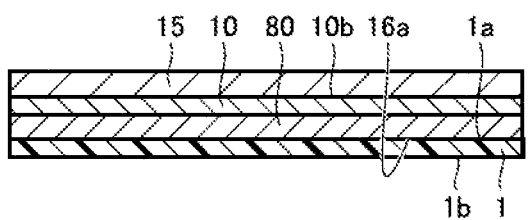
FIG. 19 is a schematic cross-sectional view for schematically illustrating a fourteenth step of the method of manufacturing the silicon carbide semiconductor device according to the embodiment.

Next, a backside electrode forming step (S80: FIG. 2) is performed. Specifically, referring to FIG. 19, with intermediate substrate 16 being supported by adhesive tape 1, a backside electrode 15 made of a material including NiSi, for example, is formed on second main surface 10b of intermediate substrate 16 while intermediate substrate 16 is cooled. Backside electrode 15 is formed by sputtering, for example, at the second pressure lower than atmospheric pressure. The pressure in the vacuum chamber during the sputtering (second pressure) is, for example, 0.3 Pa or more and 1 Pa or less. Backside electrode 15 may be formed by vapor deposition. That is, the step of processing second main surface 10b of silicon carbide substrate 10 may include a step of forming backside electrode 15 on second main surface 10b of silicon carbide substrate 10 at the second pressure lower than atmospheric pressure.

Next, a laser annealing step (S90: FIG. 2) is performed. By heating backside electrode 15 formed in contact with second main surface 10b of intermediate substrate 16, backside electrode 15 is alloyed. For example, backside electrode 15 is locally heated using laser irradiation, whereby at least a portion of backside electrode 15 silicided. In this manner, backside electrode 15 is formed in ohmic contact with silicon carbide single-crystal substrate 11 of intermediate substrate 16. In this manner, the laser annealing is performed on backside electrode 15. It is noted that the laser annealing on backside electrode 15 is performed at atmospheric pressure, for example.

Next, a reverse sputtering step (S100: FIG. 2) is performed. Specifically, intermediate substrate 16 having backside electrode 15 formed on second main surface 10b is placed in the vacuum chamber. The pressure in the vacuum chamber is, for example, about $1.5 \times 10^{-4}$ Pa. By generating a plasma in the vacuum chamber with an argon gas being introduced therein, for example, a substance adhered to backside electrode 15 is removed. Specifically, backside electrode 15 is subjected to reverse sputtering in an Ar atmosphere at a pressure of several Pa, with application of RF power of 800 W.

Figure 20:
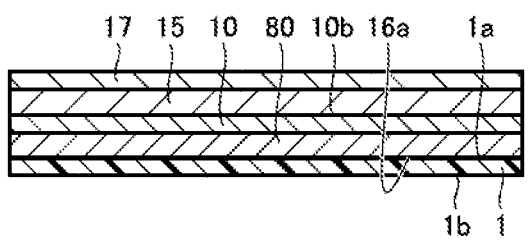
FIG. 20 is a schematic cross-sectional view for schematically illustrating a fifteenth step of the method of manufacturing the silicon carbide semiconductor device according to the embodiment.

Next, a backside surface protecting electrode forming step (S110: FIG. 2) is performed. Referring to FIG. 20, with intermediate substrate 16 being supported by adhesive tape 1, backside surface protecting electrode 17 is formed in contact with backside electrode 15. Backside surface protecting electrode 17 is made of a material including Ti, Ni and Au, for example. Specifically, a layer including Ti is formed in contact with backside electrode 15. Then, a layer including Ni is formed in contact with the layer including Ti. Then, a layer including Au is formed in contact with the layer including Ni. In this manner, backside surface protecting electrode 17 is formed in contact with backside electrode 15.

Figure 21:
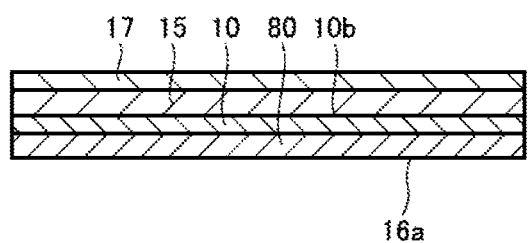
FIG. 21 is a schematic cross-sectional view for schematically illustrating a sixteenth step of the method of manufacturing the silicon carbide semiconductor device according to the embodiment.

Next, an adhesive tape peeling step (S120: FIG. 2) is performed. Specifically, adhesive tape 1 adhered to third main surface 16a of intermediate substrate 16 is peeled off (see FIG. 21). Specifically, after second main surface 10b of silicon carbide substrate 10 is processed, adhesive tape 1 is removed from surface electrode 50. Then, intermediate substrate 16 is cut in a thickness direction, whereby a plurality of MOSFETs 100 (see FIG. 1) are obtained.

Although the first conductivity type has been described as n type and the second conductivity type as p type in the above embodiment, the first conductivity type may be p type and the second conductivity type may be n type. Although the silicon carbide semiconductor device has been described as a planar type MOSFET, the silicon carbide semiconductor device may be a trench type MOSFET or IGBT (Insulated Crate Bipolar Transistor). If the silicon carbide semiconductor device is an IGBT, the surface electrode may be an emitter electrode and the backside electrode may be a collector electrode.

A function and effect of the method of manufacturing the MOSFET according to the present embodiment is now described.

According to the method of manufacturing MOSFET 100 of the present embodiment, before second main surface 10b of silicon carbide substrate 10 is ground, silicon carbide substrate 10 is heated with adhesive tape 1 being adhered to surface electrode 50. Consequently, most of the gas trapped in the space between adhesive tape 1 and surface electrode 50 can be exhausted to the outside of the space. Silicon carbide substrate 10 has an increased thickness as compared to silicon carbide substrate 10 having a reduced thickness after its second main surface 10b has been ground, so that the cracking of silicon carbide substrate 10 can be suppressed before silicon carbide substrate 10 is heated. In addition, after the step of grinding second main surface 10b, second main surface 10b of silicon carbide substrate 10 is processed at the second pressure lower than atmospheric pressure, with adhesive tape 1 being adhered to surface electrode 50. Since most of the gas trapped in the space between adhesive tape 1 and surface electrode 50 has been exhausted to the outside of the space before second main surface 10b of silicon carbide substrate 10 is ground, very little gas remains in the space between adhesive tape 1 and surface electrode 50 after second main surface 10b of silicon carbide substrate 10 is ground. Accordingly, while second main surface 10b of silicon carbide substrate 10 is processed at the second pressure lower than atmospheric pressure, the cracking of silicon carbide substrate 10 can be effectively suppressed.

Furthermore, according to the method of manufacturing MOSFET 100 of the present embodiment, the first pressure is $1 \times 10^{-5}$ Pa or more and $1 \times 10^{-2}$ Pa or less. By setting the first pressure to $1 \times 10^{-5}$ Pa or more, the process can be readily performed without having to use special high-vacuum equipment or vacuuming for an extended period of time. By setting the first pressure to $1 \times 10^{-2}$ Pa or less, the gas trapped between adhesive tape 1 and surface electrode 50 can be effectively exhausted.

Furthermore, according to the method of manufacturing MOSFET 100 of the present embodiment, the first pressure is equal to or lower than the second pressure. Consequently, the gas trapped between adhesive tape 1 and surface electrode 50 can be sufficiently exhausted before the grinding, thus effectively suppressing the cracking of silicon carbide substrate 10 after the grinding.

Furthermore, according to the method of manufacturing MOSFET 100 of the present embodiment, the temperature of silicon carbide substrate 10 in the step of heating the silicon carbide substrate is 100° C. or more and 200° C. or less. By setting the temperature of silicon carbide substrate 10 to 100° C. or more, water trapped in the space between adhesive tape 1 and surface electrode 50 can be vaporized into water vapor and the water vapor can be effectively exhausted from the space. By setting the temperature of silicon carbide substrate 10 to 200° C. or less, damage to adhesive tape 1 can be effectively prevented.

Furthermore, according to the method of manufacturing MOSFET 100 of the present embodiment, the step of processing second main surface 10b of silicon carbide substrate 10 includes the step of removing, by plasma etching, process-modified layer 10c formed on second main surface 10b in the step of grinding second main surface 10b. If the gas remains in the space between adhesive tape 1 and surface electrode 50, in the step of removing process-modified layer 10c by plasma etching, local pressure variation occurs to generate abnormal discharge during the release of the gas from between adhesive tape 1 and surface electrode 50 to the outside. This causes adhesive tape 1 to burn and adhere to silicon carbide substrate 10, resulting in difficulty in peeling adhesive tape 1 off. By exhausting the gas existing in the space between adhesive tape 1 and surface electrode 50 before the plasma etching, therefore, the occurrence of abnormal discharge during the plasma etching can be suppressed.

Furthermore, according to the method of manufacturing MOSFET 100 of the present embodiment, the step of processing second main surface 10b of silicon carbide substrate 10 includes the step of forming backside electrode 15 on second main surface 10b of silicon carbide substrate 10. If the gas such as water vapor remains in the space between adhesive tape 1 and surface electrode 50, gas such as water vapor may be generated to lower film quality of backside electrode 15 during the formation of backside electrode 15 on second main surface 10b. By exhausting the gas existing in the space between adhesive tape 1 and surface electrode 50 before forming backside electrode 15, the lowering of the film quality of backside electrode 15 can be suppressed.

Furthermore, according to the method of manufacturing MOSFET 100 of the present embodiment, the step of processing second main surface 10b of silicon carbide substrate 10 includes the step of performing laser annealing on backside electrode 15. The laser annealing locally heats backside electrode 15, thus effectively suppressing an increase in temperature of adhesive tape 1 which results in the generation of gas trapped in the space between adhesive tape 1 and surface electrode 50.

Furthermore, according to the method of manufacturing MOSFET 100 of the present embodiment, the maximum diameter of first main surface 10a of silicon carbide substrate 10 is 100 mm or more. A larger maximum diameter of first main surface 10a of the silicon carbide substrate tends to leave gas between adhesive tape 1 and surface electrode 50 during the adhesion of adhesive tape 1 to surface electrode 50. The above method of manufacturing a silicon carbide semiconductor device is more suitably used when the maximum diameter of first main surface 10a of silicon carbide substrate 10 is 100 mm or more.

Furthermore, according to the method of manufacturing MOSFET 100 of the present embodiment, after the step of grinding the second main surface of the silicon carbide substrate, thickness 1 of silicon carbide substrate 10 is 50 μm or more and 200 μm or less. A smaller thickness of silicon carbide substrate 10 tends to cause cracking of silicon carbide substrate 10. The above method of manufacturing a silicon carbide semiconductor device is more suitably used when the thickness of silicon carbide substrate 10 is 50 μm or more and 200 μm or less.

Furthermore, the method of manufacturing MOSFET 100 of the present embodiment further includes the step of, after the step of processing second main surface 10b of silicon carbide substrate 10, removing adhesive tape 1 from surface electrode 50. Adhesive tape 1 is thus peeled off from silicon carbide substrate 10.

Furthermore, according to the method of manufacturing MOSFET 100 of the present embodiment, the step of heating the silicon carbide substrate includes the step of heating silicon carbide substrate 10 with silicon carbide substrate 10 being separated from substrate holding unit 3 including heating unit 3b. Accordingly, silicon carbide substrate 10 can be flexed to exhaust the gas from between adhesive tape 1 and surface electrode 50. As a result, the cracking of silicon carbide substrate 10 can be effectively suppressed.

Furthermore, according to the method of manufacturing MOSFET 100 of the present embodiment, the step of heating the silicon carbide substrate further includes the step of, after the step of heating silicon carbide substrate 10 with silicon carbide substrate 10 being separated from substrate holding unit 3, heating silicon carbide substrate 10 with silicon carbide substrate 10 being in contact with substrate holding unit 3. Silicon carbide substrate 10 is pressed against substrate holding unit 3, whereby the gas remaining between adhesive tape 1 and surface electrode 50 is pushed and exhausted.

It should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A method of manufacturing a silicon carbide semiconductor device, comprising steps of:
preparing a silicon carbide substrate having a first main surface and a second main surface opposite to said first main surface;
forming a surface electrode in contact with said first main surface of said silicon carbide substrate;
adhering an adhesive tape to said surface electrode so as to cover said surface electrode;
heating said silicon carbide substrate at a first pressure lower than atmospheric pressure, with said adhesive tape being adhered to said surface electrode;
after said step of heating said silicon carbide substrate, grinding said second main surface of said silicon carbide substrate; and
after said step of grinding said second main surface, processing said second main surface of said silicon carbide substrate at a second pressure lower than atmospheric pressure, with said adhesive tape being adhered to said surface electrode.

2. The method of manufacturing a silicon carbide semiconductor device according to claim 1, wherein
said first pressure is $1 \times 10^{-5}$ Pa or more and $1 \times 10^{-2}$ Pa or less.

3. The method of manufacturing a silicon carbide semiconductor device according to claim 1, wherein
said first pressure is equal to or lower than said second pressure.

4. The method of manufacturing a silicon carbide semiconductor device according to claim 1, wherein
a temperature of said silicon carbide substrate in said step of heating said silicon carbide substrate is 100° C. or more and 200° C. or less.

5. The method of manufacturing a silicon carbide semiconductor device according to claim 1, wherein
said step of processing said second main surface of said silicon carbide substrate includes a step of removing, by plasma etching, a process-modified layer formed on said second main surface in said step of grinding said second main surface.

6. The method of manufacturing a silicon carbide semiconductor device according to claim 1, wherein
said step of processing said second main surface of said silicon carbide substrate includes a step of forming a backside electrode on said second main surface of said silicon carbide substrate.

7. The method of manufacturing a silicon carbide semiconductor device according to claim 6, wherein
said step of processing said second main surface of said silicon carbide substrate includes a step of performing laser annealing on said backside electrode.

8. The method of manufacturing a silicon carbide semiconductor device according to claim 1, wherein
a maximum diameter of said first main surface of said silicon carbide substrate is 100 mm or more.

9. The method of manufacturing a silicon carbide semiconductor device according to claim 1, wherein
after said step of grinding said second main surface of said silicon carbide substrate, the thickness of said silicon carbide substrate is 50 μm or more and 200 μm or less.

10. The method of manufacturing a silicon carbide semiconductor device according to claim 1, further comprising a step of, after said step of processing said second main surface of said silicon carbide substrate, removing said adhesive tape from said surface electrode.

11. The method of manufacturing a silicon carbide semiconductor device according to claim 1, wherein
said step of heating said silicon carbide substrate includes a step of heating said silicon carbide substrate with said silicon carbide substrate being separated from a substrate holding unit including a heating unit.

12. The method of manufacturing a silicon carbide semiconductor device according to claim 11, wherein
said step of heating said silicon carbide substrate further includes a step of, after said step of heating said silicon carbide substrate with said silicon carbide substrate being separated from said substrate holding unit, heating said silicon carbide substrate with said silicon carbide substrate being in contact with said substrate holding unit.

13. A method of manufacturing a silicon carbide semiconductor device, comprising steps of:
preparing a silicon carbide substrate having a first main surface and a second main surface opposite to said first main surface;
forming a surface electrode in contact with said first main surface of said silicon carbide substrate;
adhering an adhesive tape to said surface electrode so as to cover said surface electrode;
heating said silicon carbide substrate at a first pressure lower than atmospheric pressure, with said adhesive tape being adhered to said surface electrode;
after said step of heating said silicon carbide substrate, grinding said second main surface of said silicon carbide substrate; and
after said step of grinding said second main surface, processing said second main surface of said silicon carbide substrate at a second pressure lower than atmospheric pressure, with said adhesive tape being adhered to said surface electrode,
said first pressure being $1\times10^{-5}$ Pa or more and $1\times10^{-2}$ Pa or less,
a temperature of said silicon carbide substrate in said step of heating said silicon carbide substrate being 100° C. or more and 200° C. or less.

14. The method of manufacturing a silicon carbide semiconductor device according to claim 13, wherein
said first pressure is equal to or lower than said second pressure.

15. The method of manufacturing a silicon carbide semiconductor device according to claim 13, wherein
said step of processing said second main surface of said silicon carbide substrate includes a step of removing, by plasma etching, a process-modified layer formed on said second main surface in said step of grinding said second main surface.

16. The method of manufacturing a silicon carbide semiconductor device according to claim 13, wherein
said step of processing said second main surface of said silicon carbide substrate includes a step of forming a backside electrode on said second main surface of said silicon carbide substrate.

17. The method of manufacturing a silicon carbide semiconductor device according to claim 16, wherein
said step of processing said second main surface of said silicon carbide substrate includes a step of performing laser annealing on said backside electrode.

18. The method of manufacturing a silicon carbide semiconductor device according to claim 13, wherein
a maximum diameter of said first main surface of said silicon carbide substrate is 100 mm or more.

19. The method of manufacturing a silicon carbide semiconductor device according to claim 13, wherein
after said step of grinding said second main surface of said silicon carbide substrate, the thickness of said silicon carbide substrate is 50 μm or more and 200 μm or less.

20. The method of manufacturing a silicon carbide semiconductor device according to claim 13, further comprising a step of, after said step of processing said second main surface of said silicon carbide substrate, removing said adhesive tape from said surface electrode.

21. The method of manufacturing a silicon carbide semiconductor device according to claim 13, wherein
said step of heating said silicon carbide substrate includes a step of heating said silicon carbide substrate with said silicon carbide substrate being separated from a substrate holding unit including a heating unit.

22. The method of manufacturing a silicon carbide semiconductor device according to claim 21, wherein
said step of heating said silicon carbide substrate further includes a step of, after said step of heating said silicon carbide substrate with said silicon carbide substrate being separated from said substrate holding unit, heating said silicon carbide substrate with said silicon carbide substrate being in contact with said substrate holding unit.

* * * * *